(12) United States Patent
Wang et al.

(10) Patent No.: US 12,706,597 B2
(45) Date of Patent: Aug. 11, 2026

(54) DIGITAL STEP ATTENUATOR WITH A DIVERSION CIRCUIT FOR HIGH-FREQUENCY SIGNAL

(71) Applicant: MEDIATEK INC., Hsinchu City (TW)

(72) Inventors: Jhen-Kai Wang, Hsinchu City (TW); Wei-Hsin Tseng, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 124 days.

(21) Appl. No.: 18/395,917

(22) Filed: Dec. 26, 2023

(65) Prior Publication Data

US 2024/0243736 A1 Jul. 18, 2024

Related U.S. Application Data

(60) Provisional application No. 63/480,313, filed on Jan. 18, 2023.

(51) Int. Cl.
*H03K 5/01* (2006.01)
*H03K 17/687* (2006.01)

(52) U.S. Cl.
CPC ........... *H03K 5/01* (2013.01); *H03K 17/6871* (2013.01)

(58) Field of Classification Search
CPC ......... H03K 5/01; H03K 17/6871; H03H 7/25
See application file for complete search history.

(56) References Cited

U.S. PATENT DOCUMENTS

2018/0054178 A1* 2/2018 Bergsma .................. H03H 7/07
2018/0062231 A1* 3/2018 Cebi ...................... H04B 1/401
2018/0337659 A1 11/2018 Mu

OTHER PUBLICATIONS

Extended European Search Report dated Jul. 1, 2024, issued in application No. EP 24152632.6.

* cited by examiner

*Primary Examiner* — Metasebia T Retebo
(74) *Attorney, Agent, or Firm* — McClure, Qualey & Rodack, LLP

(57) ABSTRACT

A digital step attenuator (DSA) with efficient high-frequency signal attenuation is shown. The DSA has an attenuation circuit, a bypass switch, and a diversion circuit. The attenuation circuit is coupled between an input node and an output node of the digital step attenuator. The bypass switch is controlled by a bypass control signal to provide a bypass path between the input node and the output node of the digital step attenuator. The diversion circuit couples a control terminal of the bypass switch to a ground terminal in response to the bypass control signal being in an inactive state.

16 Claims, 6 Drawing Sheets

DIGITAL STEP ATTENUATOR WITH A DIVERSION CIRCUIT FOR HIGH-FREQUENCY SIGNAL

CROSS REFERENCE TO RELATED APPLICATIONS

This application claims the benefit of U.S. Provisional Application No. 63/480,313, filed Jan. 18, 2023, the entirety of which is incorporated by reference herein.

BACKGROUND OF THE INVENTION

Field of the Invention

The present invention relates to digital step attenuators.

Description of the Related Art

In radio signal (RF) applications, a digital step attenuator (DSA) is a device that attenuates or reduces the amplitude of the RF signal that passes through it. In particular, the amount of attenuation is controlled digitally.

Generally, a DSA can be digitally switched between two modes. In attenuation mode, the RF signal is attenuated by the attenuation circuit of the DSA. In a normal bypass mode, the RF signal is allowed to pass through by a bypass switch rather than by the attenuation circuit.

The accuracy of signal attenuation in the attenuation mode is an important topic in this field of technology.

BRIEF SUMMARY OF THE INVENTION

A digital step attenuator (DSA) with efficient high-frequency signal attenuation is shown.

A DSA in accordance with an exemplary embodiment of the present disclosure has an attenuation circuit, a bypass switch, and a diversion circuit. The attenuation circuit is coupled between the input node and the output node of the DSA. The bypass switch is controlled by the bypass control signal to provide a bypass path between the input node and the output node of the digital step attenuator. In response to the bypass control signal being in an inactive state, the diversion circuit couples a control terminal of the bypass switch to a ground terminal.

When the bypass control signal is switched to the inactive state, the bypass switch is open, the DSA is operated in an attenuation mode, and an input signal of the DSA is attenuated by the attenuation circuit. Although there is a high-frequency signal path through the parasitic capacitors of the bypass switch, the diversion circuit (coupled to between the gate terminal of the bypass switch and the ground terminal in the attenuation mode) effectively directs the high-frequency input signal to the ground terminal. Thus, the expected attenuation of the input signal is achieved even in the high-frequency range.

In an exemplary embodiment, the diversion circuit has a diversion capacitor.

In an exemplary embodiment, the diversion circuit further has a diversion resistor and a diversion switch coupled in series to the diversion capacitor. The diversion capacitor couples the control terminal of the bypass switch to the ground terminal through the diversion resistor when the diversion switch is closed. The diversion switch may be closed when the bypass switch is open.

In an exemplary embodiment, the diversion circuit further has an array of diversion resistors, and an array of diversion switches corresponding to the array of diversion resistors. The diversion switches are controlled to determine the amount of resistance provided by the array of diversion resistors when the bypass switch is open. When the bypass switch is open, the diversion capacitor couples the gate terminal of the MOS transistor to the ground terminal through the enabled resistors of the array of diversion resistors. The entire array of diversion switches may be open when the bypass switch is closed. By controlling the array of diversion resistors, the attenuation amount can be further adjusted to provide gain control accuracy.

In another exemplary embodiment, the diversion capacitor includes an array of capacitance components, which is provided to result in tunable capacitance. It is another way to adjust the attenuation amount.

The DSA may have a T-type circuit as the attenuation circuit. In some exemplary embodiments, the DSA may use a Pi-type circuit as the attenuation circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
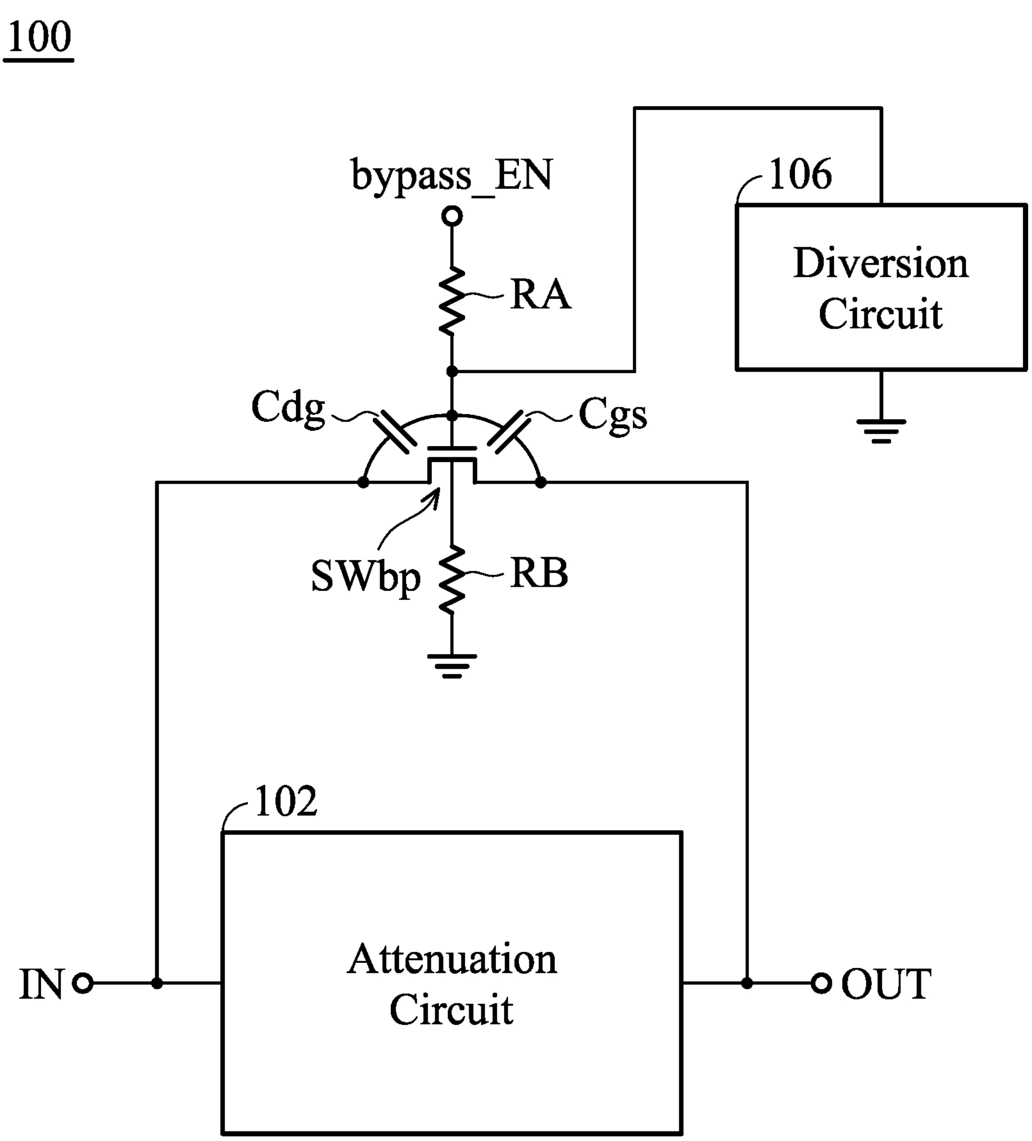
FIG. 1 depicts a digital step attenuator (DSA) 100 in accordance with an exemplary embodiment of the disclosure.

FIG. 1 depicts a digital step attenuator (DSA) 100 in accordance with an exemplary embodiment of the disclosure.

The DSA 100 has an attenuation circuit 102, a bypass switch SWbp, and a diversion circuit 106.

The attenuation circuit 102 is coupled between an input node IN and an output node OUT of the DSA 100 for signal attenuation. The bypass switch SWbp is implemented by a metal-oxide semiconductor (MOS) transistor controlled by a bypass control signal bypass_En. The diversion circuit 106 may have a capacitor. The diversion circuit 106 couples a gate terminal of the MOS transistor (also labeled as SWbp hereinafter) to a ground terminal in response to the bypass control signal bypass_En being in an inactive state.

When the bypass control signal bypass_En is switched to its active state, the bypass switch SWbp is closed, the DSA 100 is operated in a normal bypass mode. The bypass switch SWbp provides a bypass path between the input node IN and the output node OUT of the DSA 100. An input signal (also labeled as IN hereinafter) of the DSA 100 is transferred through the closed bypass switch SWbp without attenuation. On the contrary, when the bypass control signal bypass_En is switched to its inactive state, the bypass switch SWbp is open, and the DSA 100 is operated in an attenuation mode. The input signal IN of the DSA 100 is attenuated by the attenuation circuit 102. Signal attenuation is achieved.

Note that the MOS transistor SWbp may have a parasitic capacitor Cdg between its drain and gate terminals, and a parasitic capacitor Cgs between its gate and source terminals. In a conventional structure without the diversion circuit 106, the parasitic capacitors Cdg and Cgs form a high-pass path that may leak the high-frequency input signal IN to the output node OUT even though the DSA 100 is operated in the attenuation mode. With the diversion circuit 106, the high-frequency input signal IN is directed to the ground terminal rather than being passed to the output node OUT in the attenuation mode. The proposed DSA 100 works well in high-frequency attenuation.

Especially, the diversion circuit 106 is different from the bootstrapping resistors RA and RB coupled at the gate terminal of the MOS transistor SWbp. The resistor RA is coupled between the gate terminal of the MOS transistor SWbp and a receiving node of the bypass control signal bypass_En. The resistor RB is always coupled between the gate terminal of the MOS transistor SWbp and the ground terminal. In the other exemplary embodiments, the resistors RA and RB may be replaced by the other electronic components, and should not be interpreted as the diversion circuit 106.

Figure 2:
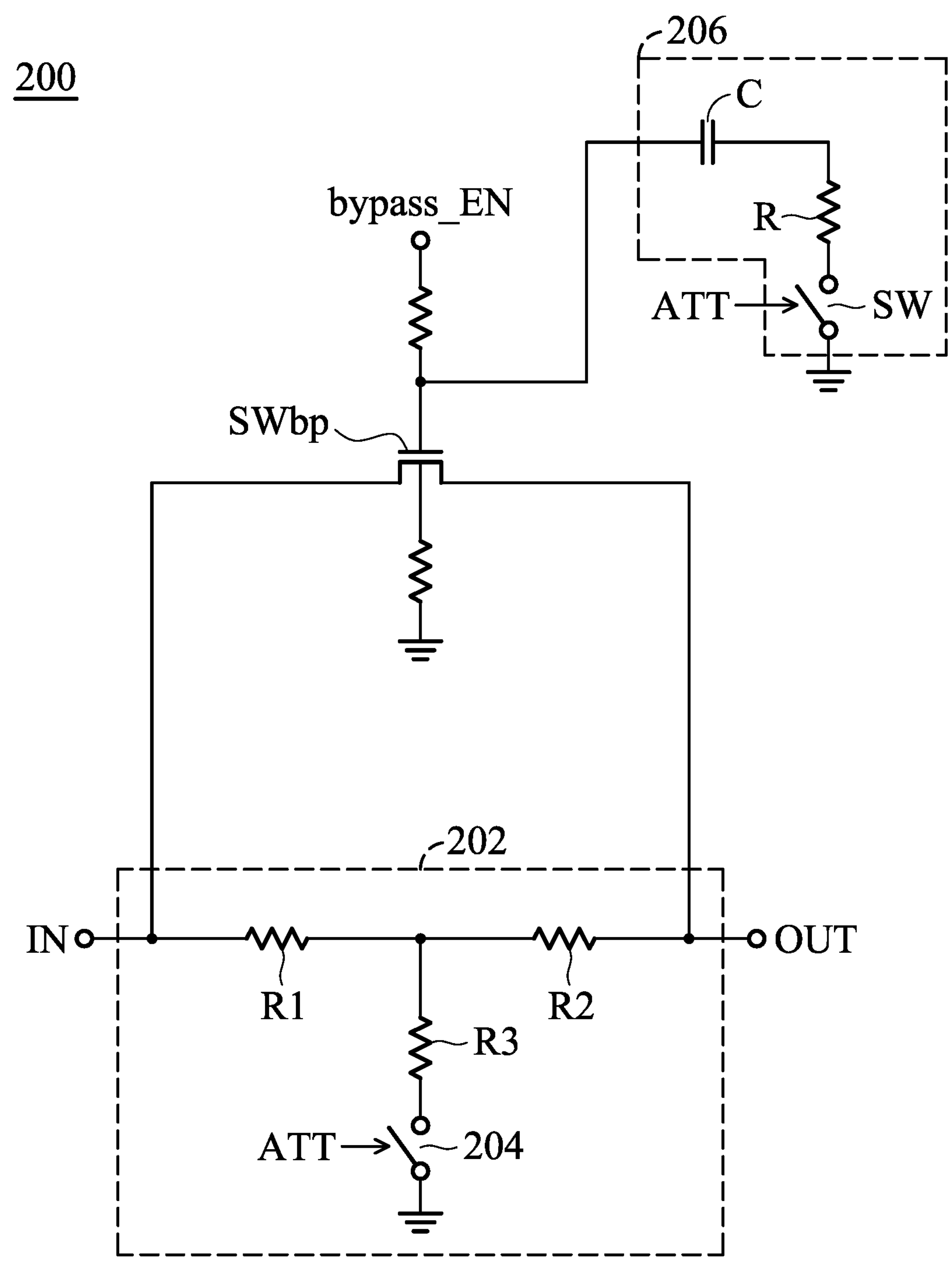
FIG. 2 illustrates a DSA 200 in accordance with an exemplary embodiment of the disclosure, wherein the attenuation circuit of the DSA 200 is a T-type circuit 202.

FIG. 2 illustrates a DSA 200 in accordance with an exemplary embodiment of the disclosure, wherein the attenuation circuit of the DSA 200 is a T-type circuit 202.

The T-type circuit 202 has a first resistor R1 and a second resistor R2 coupled in series between the input node IN and the output node OUT of the DSA 200. The T-type circuit 202 further has a third resistor R3 that couples the connection node between the first resistor R1 and the second resistor R2 to the ground terminal when a switch 204 is closed. The switch 204 is controlled by an attenuation control signal ATT. When the bypass control signal bypass_En is in its inactive state, the switch 204 is closed by the attenuation control signal ATT to enable the T-type circuit 202 to build a signal attenuation path in the DSA 200. When the bypass control signal bypass_En is in its active state, the switch 204 is open by the attenuation control signal ATT to disable the T-type circuit 202 and block the signal attenuation path. In the other exemplary embodiments, the resistors R1, R2 and R3 may be replaced by the other electronic components.

In FIG. 2, the diversion circuit 206 has a diversion capacitor C, a diversion resistor R, and a diversion switch SW, which are connected in series. The diversion capacitor C couples the gate terminal of the MOS transistor SWbp to the ground terminal through the diversion resistor when the diversion switch SW is closed. The diversion switch SW can be controlled by the attenuation control signal ATT, too. When the bypass switch SWbp is open and the T-type circuit 202 is enabled to provide the signal attenuation path, the diversion circuit 206 is enabled by closing the diversion switch SW. Thus, the high-frequency signal is prevent from leaking to the output node OUT. High-frequency attenuation is guaranteed.

Figure 3:
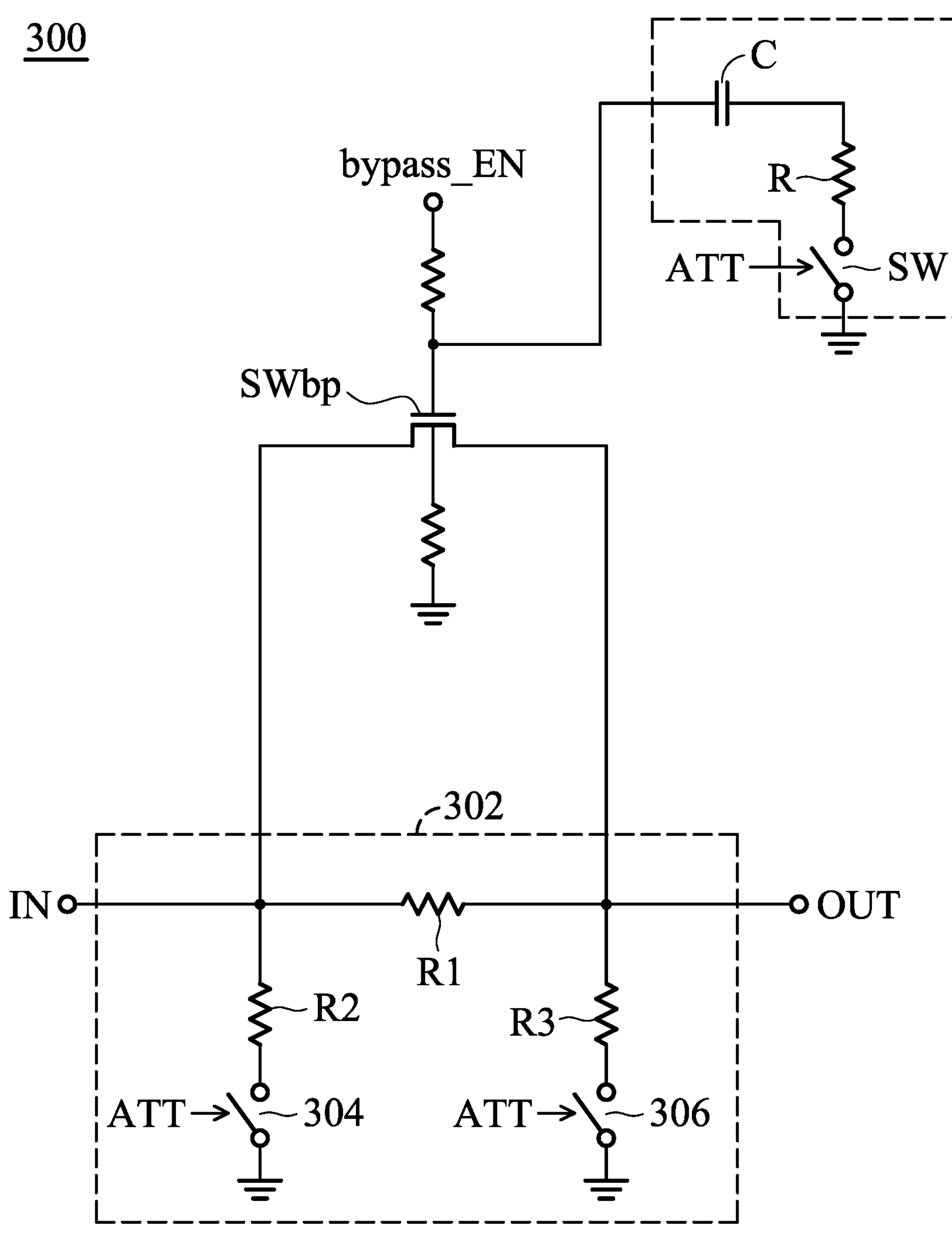
FIG. 3 illustrates a DSA 300 in accordance with an exemplary embodiment of the disclosure, wherein the attenuation circuit of the DSA 300 is a Pi-type circuit 302.

FIG. 3 illustrates a DSA 300 in accordance with an exemplary embodiment of the disclosure, wherein the attenuation circuit of the DSA 300 is a Pi-type circuit 302.

The Pi-type circuit 302 has a first resistor R1 coupled between the input node IN and the output node OUT of the DSA 300. The Pi-type circuit 302 further has a second resistor R2 and a third resistor R3. The second resistor R2 couples a first node of the first resistor R1 to the ground terminal when the switch 304 is closed. The third resistor R3 couples a second node of the first resistor R1 to the ground terminal when the switch 306 is closed. The switches 304 and 306 are controlled by an attenuation control signal ATT. When the bypass control signal bypass_En is in its inactive state, the switches 304 and 306 are closed by the attenuation control signal ATT to enable the Pi-type circuit 302 to build a signal attenuation path in the DSA 300. When the bypass control signal bypass_En is in its active state, the switches 304 and 306 are open by the attenuation control signal ATT to disable the Pi-type circuit 302 and block the signal attenuation path. In the other exemplary embodiments, the resistors R1, R2 and R3 may be replaced by the other electronic components.

In FIG. 3, the diversion circuit having a diversion capacitor C, a diversion resistor R, and a diversion switch SW connected in series also helps a lot to deal with the high pass problem due to the high-pass path formed by the parasitic capacitors of the MOS transistor SWbp.

There are variants for the proposed diversion circuit.

Figure 4A:
FIG. 4A depicts a diversion circuit 410 in accordance with an exemplary embodiment of the disclosure, which provides tunable diversion resistance.
Figure 4A:
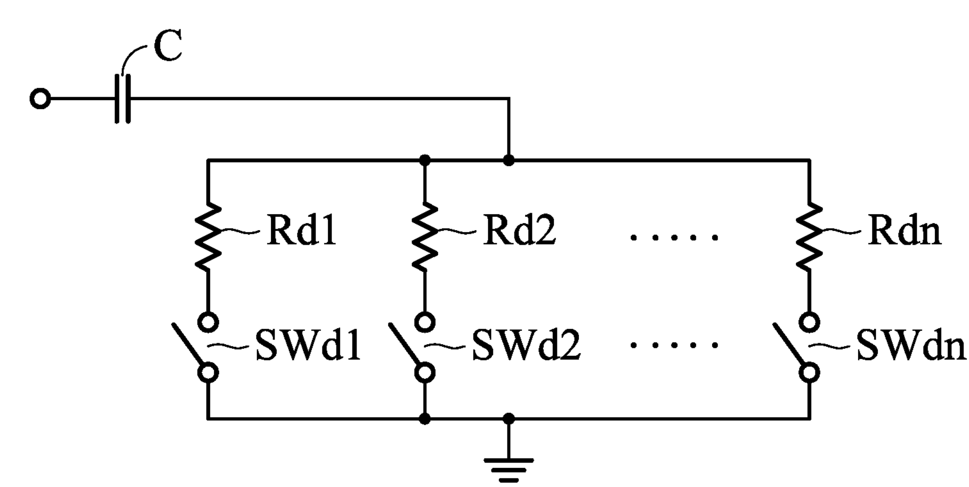

FIG. 4A depicts a diversion circuit 410 in accordance with an exemplary embodiment of the disclosure, which provides tunable diversion resistance. In addition to the diversion capacitor C, the diversion circuit 410 further has an array of diversion resistors Rd1, Rd2, . . . Rdn, and an array of diversion switches SWd1, SWd2, . . . . , SWdn corresponding to the array of diversion resistors Rd1, Rd2, . . . Rdn. The diversion switches SWd1, SWd2, . . . , SWdn are controlled to determine the amount of resistance provided by the array of diversion resistors Rd1, Rd2, . . . Rdn when the bypass switch SWbp is open. In this manner, in the attenuation mode of the DAS, the diversion capacitor C couples the gate terminal of the MOS transistor SWbp to the ground terminal through only the enabled resistors of the array of diversion resistors Rd1, Rd2, . . . Rdn. The resistance along the diversion circuit 410 is tunable. The entire array of diversion switches SWd1, SWd2, . . . , SWdn may be open when the bypass switch SWbp is closed.

Figure 4B:
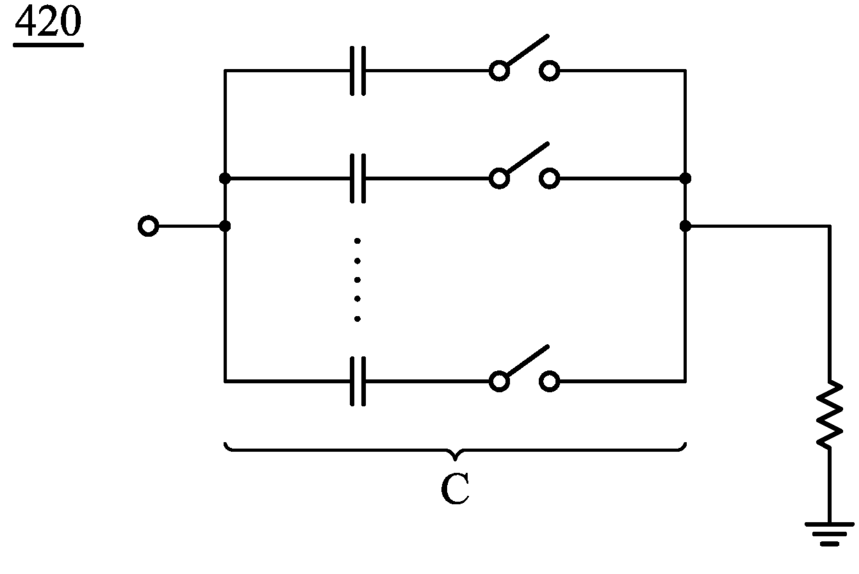
FIG. 4B depicts a diversion circuit 420 in accordance with another exemplary embodiment of the disclosure, which provides tunable diversion capacitance.

FIG. 4B depicts a diversion circuit 420 in accordance with another exemplary embodiment of the disclosure, which provides tunable diversion capacitance. The diversion capacitor C is implemented by an array of capacitance components, which is provided to result in tunable diversion capacitance.

Figure 5:
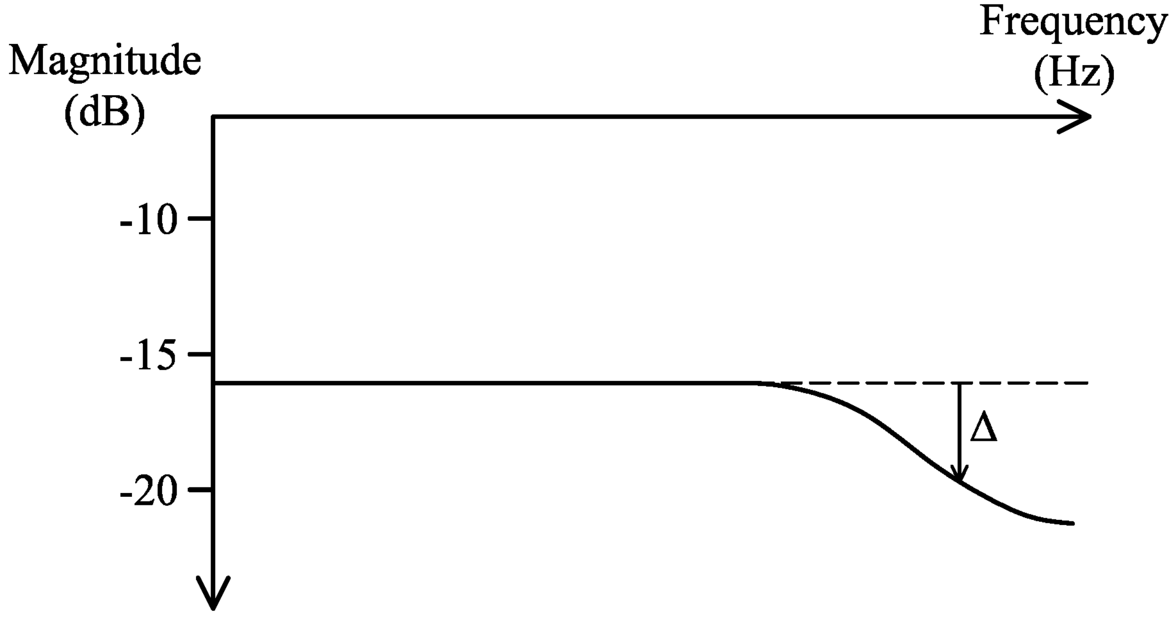
FIG. 5 depicts the Bode diagram of the proposed DSA in accordance with an exemplary embodiment.

FIG. 5 depicts the Bode diagram of the proposed DSA in accordance with an exemplary embodiment. In this example, the DSA is designed to provide 16 dB attenuation. With the proposed diversion circuit, the high-frequency input signal is successfully attenuated. The drop Δ at the high-frequency range can be controlled by the tunable diversion resistance introduced in FIG. 4A, or the tunable diversion capacitance introduced in FIG. 4B.

In some examples, a diversion circuit may have both the tunable diversion resistance (FIG. 4A) and the tunable diversion capacitance (FIG. 4B).

Figure 6:
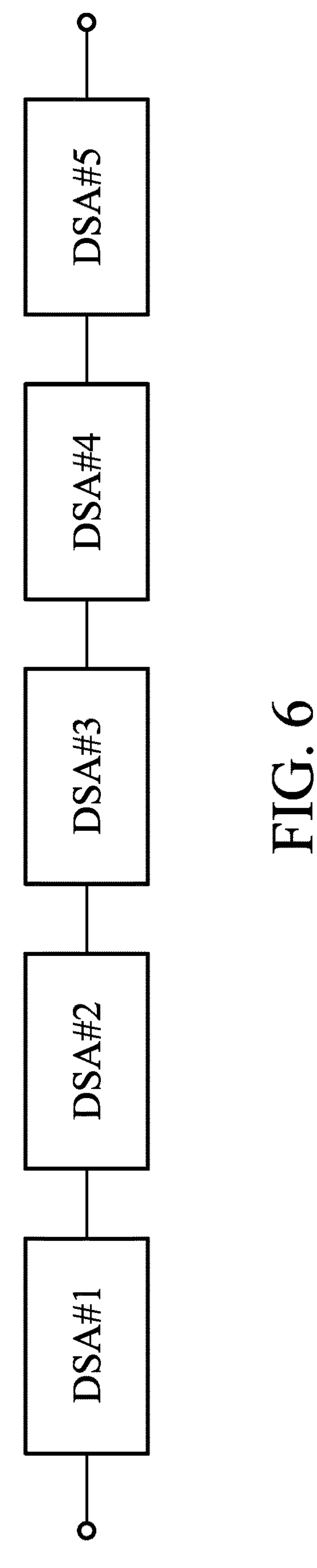
FIG. 6 depicts a multi-stage DSA 600 in accordance with an exemplary embodiment of the disclosure.

FIG. 6 depicts a multi-stage DSA 600 in accordance with an exemplary embodiment of the disclosure, which is cascaded from DSA units DSA #1, DSA #2, DSA #3, DSA #4, and DSA #5, wherein the DSA units DSA #1~DSA #5 may be implemented by any of the aforementioned DSA structures. Generally, complex inductor-capacitor (LC) matching networks are used at the connection nodes between the DSA units.

In some exemplary embodiments, the MOS transistor SWbp does not require separated layout in its oxide diffusion (OD) layer. The high-frequency input signal of the DSA is directed to the ground terminal through the proposed diversion circuit rather than being passed to the output node OUT of the DSA through the parasitic capacitors of the MOS transistor SWbp. The complex OD layout is not necessary.

In the other exemplary embodiments, the attenuation circuit is not limited to the T-type circuit of FIG. 2, or the Pi-type circuit of FIG. 3. Any attenuation design may be used to implement the attenuation circuit of the proposed DSA.

In some exemplary embodiments, the bypass design uses a bipolar transistor (BJT) as a switch to replace the MOS transistor SW bp shown in the figures. In such examples, the diversion circuit is coupled to a based terminal of the BJT switch. Or, the bypass switch may be implemented any kind of transistor. In some exemplary embodiments, the bypass path provided by the DSA may be more complex. Any bypass design with a bypass switch having a control terminal coupling to the ground through the proposed diversion circuit should be considered within the scope of the present invention.

In some exemplary embodiments, the diversion circuit may have more components than those illustrated in the figures. Any high-pass circuit may implement the diversion circuit.

In some exemplary embodiments, the diversion circuits within the different DSA units in the same multi-stage DSA may have some changes.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital step attenuator, comprising:

an attenuation circuit, coupled between an input node and an output node of the digital step attenuator;

a bypass switch, controlled by a bypass control signal to provide a bypass path between the input node and the output node of the digital step attenuator; and a diversion circuit, coupling a control terminal of the bypass switch to a ground terminal in response to the bypass control signal being in an inactive state;

wherein the diversion circuit has a capacitance device coupled to the control terminal of the bypass switch, and a resistance device coupled in series between the capacitance device and the ground terminal in response to the bypass control signal being in the inactive state.

2. The digital step attenuator as claimed in claim 1, wherein:

the capacitance device is a diversion capacitor of a fixed capacitance value;

the resistance device is a diversion resistor of a fixed resistance value;

the diversion circuit further has a diversion resistor and a diversion switch, wherein the diversion resistor and the diversion switch are coupled in series to the diversion capacitor; and the diversion capacitor couples the control terminal of the bypass switch to the ground terminal through the diversion resistor when the diversion switch is closed.

3. The digital step attenuator as claimed in claim 2, wherein:

the diversion switch is closed when the bypass switch is open.

4. The digital step attenuator as claimed in claim 1, wherein:

the resistance device is an array of diversion resistors;

the diversion circuit further has an array of diversion switches corresponding to the array of diversion resistors;

the diversion switches are controlled to determine an amount of resistance provided by the array of diversion resistors when the bypass switch is open; and when the bypass switch is open, the diversion capacitor capacitance device couples the control terminal of the bypass switch to the ground terminal through enabled resistors of the array of diversion resistors.

5. The digital step attenuator as claimed in claim 4, wherein:

the entire array of diversion switches is open when the bypass switch is closed.

6. The digital step attenuator as claimed in claim 1, wherein:

the diversion capacitor capacitance device includes an array of capacitance components, which provides a tunable capacitance.

7. The digital step attenuator as claimed in claim 1, wherein:

the attenuation circuit is a T-type circuit;

the T-type circuit has a first electronic component and a second electronic component coupled in series between the input node and the output node of the digital step attenuator; and the T-type circuit further has a third electronic component that couples a connection node between the first electronic component and the second electronic component to the ground terminal in response to the bypass control signal being in the inactive state.

8. The digital step attenuator as claimed in claim 7, wherein:

the first electronic component, the second electronic component, and the third electronic component are resistors.

9. The digital step attenuator as claimed in claim 1, wherein:

the attenuation circuit is a Pi-type circuit;

the Pi-type circuit has a first electronic component coupled between the input node and the output node of the digital step attenuator; and the Pi-type circuit further has a second electronic component coupling a first node of the first electronic component to the ground terminal in response to the bypass control signal being in the inactive state, and a third electronic component coupling a second node of the first electronic component to the ground terminal in response to the bypass control signal being in the inactive state.

10. The digital step attenuator as claimed in claim 9, wherein:

the first electronic component, the second electronic component, and the third electronic component are resistors.

11. The digital step attenuator as claimed in claim 1, further comprising:

a first additional electronic component, coupled between the control terminal of the bypass switch and a receiving node of the bypass control signal.

12. The digital step attenuator as claimed in claim 11, wherein:

the first additional electronic component is a resistor.

13. The digital step attenuator as claimed in claim 1, further comprising:

a second additional electronic component, always coupled between the control terminal of the bypass switch and the ground terminal.

14. The digital step attenuator as claimed in claim 13, wherein:

the second additional electronic component is a resistor.

15. The digital step attenuator as claimed in claim 1, wherein:

the bypass switch is a metal-oxide semiconductor transistor with a gate terminal as the control terminal.

16. The digital step attenuator as claimed in claim 1, wherein:

the bypass switch is a bipolar transistor with a base terminal as the control terminal.

* * * * *